United States Patent
Kouno et al.

(10) Patent No.: US 9,963,587 B2
(45) Date of Patent: May 8, 2018

(54) EPOXY RESIN COMPOSITION FOR SEMICONDUCTOR ENCAPSULATION AND METHOD FOR MANUFACTURING SEMICONDUCTOR DEVICE

(71) Applicant: NAGASE CHEMTEX CORPORATION, Osaka-shi, Osaka (JP)

(72) Inventors: Yukari Kouno, Tatsuno (JP); Katsushi Kan, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 0 days. days.

(21) Appl. No.: 14/415,231

(22) PCT Filed: Jul. 16, 2013

(86) PCT No.: PCT/JP2013/069252
§ 371 (c)(1),
(2) Date: Jan. 16, 2015

(87) PCT Pub. No.: WO2014/013970
PCT Pub. Date: Jan. 23, 2014

(65) Prior Publication Data
US 2015/0175800 A1    Jun. 25, 2015

(30) Foreign Application Priority Data
Jul. 19, 2012 (JP) .................. 2012-160143

(51) Int. Cl.
| | |
|---|---|
| C08L 63/00 | (2006.01) |
| C08G 59/68 | (2006.01) |
| C08G 59/42 | (2006.01) |
| H01L 21/52 | (2006.01) |
| H01L 23/00 | (2006.01) |
| H01L 23/29 | (2006.01) |
| C08G 59/24 | (2006.01) |
| H01L 21/56 | (2006.01) |

(52) U.S. Cl.
CPC ............ *C08L 63/00* (2013.01); *C08G 59/245* (2013.01); *C08G 59/42* (2013.01); *C08G 59/4223* (2013.01); *C08G 59/4238* (2013.01); *C08G 59/686* (2013.01); *H01L 21/52* (2013.01); *H01L 23/293* (2013.01); *H01L 24/13* (2013.01); *H01L 24/29* (2013.01); *C08G 2190/00* (2013.01); *C08L 2203/206* (2013.01); *H01L 21/563* (2013.01); *H01L 2224/13147* (2013.01); *H01L 2224/2929* (2013.01); *H01L 2224/73204* (2013.01); *H01L 2924/12042* (2013.01); *H01L 2924/181* (2013.01)

(58) Field of Classification Search
CPC ....................................................... C08L 63/00
See application file for complete search history.

(56) References Cited

U.S. PATENT DOCUMENTS

| | | | |
|---|---|---|---|
| 2004/0075802 A1* | 4/2004 | Kitamura ............. | C08G 59/621 349/153 |
| 2006/0154078 A1* | 7/2006 | Watanabe ............. | C09J 7/0203 428/413 |
| 2011/0241228 A1 | 10/2011 | Enomoto et al. | |
| 2011/0294954 A1* | 12/2011 | Fukutani .................. | C08F 2/22 525/118 |

FOREIGN PATENT DOCUMENTS

| | | | | |
|---|---|---|---|---|
| CN | 102453340 A | | 5/2012 | |
| CN | 102471464 A | | 5/2012 | |
| JP | 2001261931 A | * | 9/2001 | |
| JP | 2002155236 A | * | 5/2002 | |
| JP | 2003049050 A | * | 2/2003 | |
| JP | 2005-105243 A | | 4/2005 | |
| JP | 2005105243 A | * | 4/2005 | |
| JP | 2007197572 A | * | 8/2007 | |
| JP | 2009-041019 A | | 2/2009 | |
| JP | 2009-242685 A | | 10/2009 | |
| JP | 2011-190395 A | | 9/2011 | |
| JP | 2012-056979 A | | 3/2012 | |
| JP | 2012056979 A | * | 3/2012 | |
| JP | 2012-077129 A | | 4/2012 | |
| JP | 2012-089740 A | | 5/2012 | |
| JP | 2012-089750 A | | 5/2012 | |
| WO | 2010/090246 A1 | | 8/2010 | |
| WO | WO 2010090246 A1 | * | 8/2010 | ............... C08F 2/22 |
| WO | 2011/013326 A1 | | 2/2011 | |

OTHER PUBLICATIONS

International Search Report for PCT/JP2013/069252 dated Oct. 8, 2013.
Office Action dated Dec. 2, 2016, issued by the Taiwanese Intellectual Property Office in corresponding Taiwanese Application No. 102125201.

* cited by examiner

*Primary Examiner* — Randy P Gulakowski
*Assistant Examiner* — Ha S Nguyen
(74) *Attorney, Agent, or Firm* — Sughrue Mion, PLLC

(57) ABSTRACT

There are provided an epoxy resin composition for encapsulation, which is particularly suitable for use in resin pre-setting type flip-chip mounting of a Cu post chip, and which is capable of suppressing defects due to the generation of voids; and a method for manufacturing a semiconductor device using a Cu post chip. The present invention provides an epoxy resin composition for semiconductor encapsulation for flip-chip mounting, which contains an epoxy resin (A), a curing agent (B), a curing accelerator (C), and 3 to 64 parts by weight, relative to 100 parts by weight of the component (A), of thermally thickening resin particles (D) having a volume-average primary particle diameter of 0.2 to 10 μm; and a method for manufacturing a semiconductor device by resin pre-setting type flip-chip mounting of a Cu post chip using the composition.

9 Claims, No Drawings

EPOXY RESIN COMPOSITION FOR SEMICONDUCTOR ENCAPSULATION AND METHOD FOR MANUFACTURING SEMICONDUCTOR DEVICE

CROSS REFERENCE TO RELATED APPLICATIONS

This application is a National Stage of International Application No. PCT/JP2013/069252 filed Jul. 16, 2013, claiming priority based on Japanese Patent Application No. 2012-160143 filed Jul. 19, 2012, the contents of all of which are incorporated herein by reference in their entirety.

TECHNICAL FIELD

The present invention relates to an epoxy resin composition for semiconductor encapsulation and a method for manufacturing a semiconductor device, more particularly relates to an epoxy resin composition for encapsulation particularly suitably applicable to resin pre-setting type flip-chip mounting of a Cu post chip, and a method for manufacturing a semiconductor device using a Cu post chip.

BACKGROUND ART

As a method of mounting a semiconductor chip to a circuit board, flip-chip mounting is increasing in response to a request for further reductions in weight, thickness and size of a package. In mounting of a flip-chip, there has been heretofore performed, for example, a method called "resin pre-setting mounting" in which an encapsulation resin is supplied in advance onto a substrate and then electrical connection is performed with a chip being pressure-bonded to a circuit on the substrate and curing of the encapsulation resin is also performed.

In this flip-chip mounting, there has been studied shift from chips with Au studs, conventionally widely used, to chips using Cu posts, excellent in electrical properties. In a substrate of a chip using a Cu post, connection to a circuit on the substrate is performed by fusion of solder provided at the tip portion of the post. At this time, in order to prevent the solder from protruding and flowing off a prescribed region on the substrate, a solder resist pattern is applied in advance to a region into which the solder is prevented from protruding, and a solder resist is not applied to a junction with the post. Thus, there has been made a manipulation so as to allow the solder to be placed on only a prescribed site. Accordingly, a boundary between the region where the solder resist is applied and the region where the solder resist is not applied is present in the form of a step on the substrate. It has been revealed that in resin pre-setting type flip-chip mounting, the presence of this step causes void generation due to trapping of entrained air when a chip and a substrate are pressed toward each other and an encapsulation resin is thereby forced to flow and spread in a gap between the chip and the substrate.

Moreover, it is necessary to heat up to a reflow temperature of the solder and the heating requires a higher temperature than a pressure-bonding step with a conventional Au stud. Therefore, there has been recognized the following problem: an encapsulation resin decreases in viscosity to have increased flowability and misalignment may occur before the resin is cured.

Various types of epoxy resin compositions for semiconductor encapsulation have been known; for example, an encapsulation resin provided with a latent thickening effect by blending a relatively small amount, i.e., 0.1 to 5 phr of acrylic polymer fine particles is disclosed in Patent Document 1. This encapsulation resin, however, is an encapsulant suited for wire bonding type IC chips and does not solve the above-described problems.

PRIOR ART DOCUMENTS

Patent Documents

Patent Document 1: JP-A-2012-77129

SUMMARY OF THE INVENTION

Problems to be Solved by the Invention

An object of the present invention is to provide an epoxy resin composition for encapsulation particularly suitably applicable to resin pre-setting type flip-chip mounting of a Cu post chip and capable of suppressing defects caused by void generation, and a method for manufacturing a semiconductor device using a Cu post chip.

Solutions to the Problems

The present invention provides an epoxy resin composition for semiconductor encapsulation for flip-chip mounting, the composition containing an epoxy resin (A), a curing agent (B), a curing accelerator (C), and 3 to 64 parts by weight, relative to 100 parts by weight of the component (A), of thermally thickening resin particles (D) having a volume-average primary particle diameter of 0.2 to 10 µm.

The present invention also provides a method for manufacturing a semiconductor device with flip-chip mounting, the method including step (1) of supplying a liquid epoxy resin composition for semiconductor encapsulation to an electrode surface of a substrate having an electrode, step (2) of thickening the resin composition by heating the substrate, and step (3) of press-pressurizing a semiconductor chip with a bump formed, against the thickened resin composition under heating, and simultaneously spreading and filling the resin composition in a gap between the substrate and the semiconductor chip.

Advantages of the Invention

The epoxy resin composition for encapsulation of the present invention maintains its liquid state in which it can be supplied at room temperature, and the epoxy resin composition is thickened by thermally thickening resin particles due to heating. For example, when the thermally thickening resin particles are acrylic resin particles, the viscosity of the epoxy resin composition decreases with increase in temperature from room temperature, and on the other hand, the acrylic resin particles start to swell in the epoxy resin with increase in temperature, and then cause increase in viscosity. As a result, the viscosity of the epoxy resin composition starts to increase on arrival at a certain temperature and the epoxy resin composition is thickened. Then, the epoxy resin composition can be cured with its high viscosity being maintained even if the temperature is further raised. The epoxy resin composition has such a viscosity profile until arriving at completion of curing. Accordingly, the resin viscosity can be maintained in a somewhat high state at the time of forcing the resin to spread by press pressurization of a chip in resin pre-setting mounting. As a result, the present inventor surprisingly has found the effect that trapped voids are eliminated.

The composition of the present invention solves such problems revealed with respect to resin pre-setting mounting of a Cu post chip, and especially it can realize resin pre-setting flip-chip mounting with good workability while suppressing defects caused by void generation, and can be particularly suitably used for a method for manufacturing a semiconductor device using a Cu post chip.

MODE FOR CARRYING OUT THE INVENTION

In the present invention, an epoxy resin commonly used as a resin for encapsulation is applicable as the epoxy resin (A), and examples thereof include bisphenol A epoxy resins, bisphenol F epoxy resins, bisphenol AD epoxy resins, naphthalene epoxy resins, biphenyl epoxy resins, glycidyl amine epoxy resins, alicyclic epoxy resins, dicyclopentadiene epoxy resins, polyether epoxy resins, and silicone-modified epoxy resins. These may be used singly or two or more may be used in combination. For example, an epoxy resin that is solid at room temperature may be blended with an epoxy resin that is liquid at room temperature so as to be liquid at room temperature in combination. Among them, naphthalene epoxy resins, bisphenol A epoxy resins, bisphenol F epoxy resins, and bisphenol AD epoxy resins are preferred, and naphthalene epoxy resins are more preferred in respect of moisture resistance.

Although a curing agent usable for an epoxy resin can be used as the curing agent (B) in the present invention, acid anhydrides are particularly preferred, and examples thereof include hexahydrophthalic anhydride, alkylhexahydrophthalic anhydrides, alkyltetrahydrophthalic anhydrides, trialkyltetrahydrophthalic anhydrides, methylnadic anhydride, and methylnorbornane-2,3-dicarboxylic acid. These may be used singly or two or more may be used in combination. Among them, trialkyltetrahydrophthalic anhydrides are preferred from the viewpoint of low out-gassing. As the alkyl groups of trialkyltetrahydrophthalic anhydrides, linear or branched alkyl groups having 1 to 10 carbon atoms are preferred, alkyl groups having 1 to 6 carbon atoms are more preferred, and alkyl groups having 1 to 4 carbon atoms are even more preferred. The respective alkyl groups of the trialkyl group may each be the same or different.

In the present invention, as to the amount of the curing agent (B) blended, the number of moles of the functional groups of the curing agent is preferably 0.6 to 1.2 times, more preferably 0.7 to 1.0 time, the number of moles of the epoxy groups in the epoxy resin (A) in the composition. When the amount of the curing agent blended is less than the above range, there is a possibility of resulting in insufficient curing, whereas when the amount is excessively large, it is possible that the curing agent bleeds.

In the present invention, a curing accelerator (C) is used in order to accelerate a reaction between an epoxy resin and a curing agent. As the curing accelerator (C), one that accelerates a reaction between the epoxy resin (A) and the curing agent (B) can be used; examples thereof include imidazole-based curing accelerators, phosphorus-based curing accelerators, and urea-based curing accelerators when the curing agent (B) is an acid anhydride. Among them, imidazole-based curing agents are preferred from the viewpoint of reactivity. These may be used singly or two or more may be used in combination.

Generally, from the viewpoint of the curing temperature, the amount of the curing accelerator (C) blended, which may vary depending upon the type of this agent, is preferably 3 to 15 parts by weight, more preferably 5 to 10 parts by weight, relative to 100 parts by weight of the epoxy resin (A).

The curing accelerator (C) may be a microcapsule curing accelerator, in which a curing accelerating compound is encapsulated within a shell (namely, outer shell) substance. Examples of this type include NOVACURE HX-3088 and NOVACURE HX-3941 (both, trade names; adducts of an imidazole-based compound and an epoxy resin; both produced by Asahi Kasei Epoxy Co., Ltd.). In the present invention, the amount of a microcapsule curing accelerator blended is an amount in terms of its effective amount of the curing accelerating compound.

In the present invention, the thermally thickening resin particles (D) may be any particles capable of thickening an epoxy resin composition by its swelling or the like in the composition due to heating; specifically, there can be used particles of a vinyl chloride resin, a polyamide resin, or an acrylic resin, and preferably acrylic resin particles having a volume-average primary particle diameter of 0.2 to 10 μm can be used. When the particle diameter is 0.2 μm or more, the dispersibility of the particles in an epoxy resin is good, whereas when the particle diameter is 10 μm or less, a good connection property between a chip and a substrate is attained. Preferably, the particle diameter is 0.5 to 3 μm. The volume-average primary particle diameter can be measured by diluting an acrylic resin particle emulsion with ion-exchanged water and using a laser diffraction scattering particle size distribution analyzer (e.g., LA-910W manufactured by HORIBA, Ltd.).

Examples of the thermally thickening resin particles (D) include acrylic resin particles made of a homo- or co-polymer of a monomer or monomers such as (meth)acrylates (e.g., alkyl (e.g., methyl, ethyl, propyl, butyl, and octyl) (meth)acrylates, and phenyl (meth)acrylate), functional group-containing (meth)acrylates (e.g., 2-hydroxyethyl (meth)acrylate and glycidyl (meth)acrylate), and acrylic acids (e.g., (meth)acrylic acid, crotonic acid, and itaconic acid).

The acrylic resin particles may be particles having a core-shell structure. Particles having a core-shell structure can be obtained, for example, by polymerizing shell particles in the presence of core particles and a technique thereof is well known to persons skilled in the art.

In this case, examples of the shell polymer include copolymers of monomers such as methyl (meth)acrylate, n-, i- or tert-butyl (meth)acrylate, and (meth)acrylic acid (containing these components in amounts of 55 to 79.5 mol %, 20 to 40 mol %, and 0.5 to 10 mol %, respectively, for example). Examples of the core polymer include copolymers of monomers such as methyl (meth)acrylate and n-, i-, or tert-butyl (meth)acrylate (containing these components in amounts of 20 to 70 mol % and 30 to 80 mol %, respectively, for example). The weight ratio of the core polymer to the shell polymer is allowed to be 10/90 to 90/10.

Examples of the aforementioned acrylic resin particles include those that swell in an epoxy resin composition due to heating and those that swell and dissolve in an epoxy resin composition due to heating; those that swell and dissolve in an epoxy resin composition due to heating are preferred from the viewpoint of thickening property.

In the composition of the present invention, the amount of the aforementioned thermally thickening resin particles (D) blended is preferably 3 to 64 parts by weight, more preferably 6 to 50 parts by weight, per 100 parts by weight of the epoxy resin from the viewpoint of the viscosity of the resin composition at the time of heating.

In the present invention, an inorganic filler may be further blended. Examples of the inorganic filler include inorganic particles, such as silica fillers (e.g., fused silica and crystal silica), quartz glass powder, calcium carbonate, and aluminum hydroxide. Among them, silica fillers are preferred, and fused silica is more preferred. The amount of the inorganic filler blended is preferably 30 to 67 parts by weight, more preferably 55 to 62 parts by weight, relative to 100 parts by weight of the whole of the resin composition from the viewpoint of the viscosity of the composition at the time of supply.

When the inorganic filler is used, a silane coupling agent may be used. Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, and vinyltriethoxysilane; these may be used singly or two or more may be used in combination. The amount of the silane coupling agent blended is preferably 0.01 to 5 parts by weight, more preferably 0.1 to 2 parts by weight, relative to 100 parts by weight of the whole of the resin composition.

For the composition of the present invention may be used other additives unless the object of the present invention is impaired. Examples of such additives include defoaming agents, leveling agents, low-stress agents, and pigments. Preferably, no solvents are used.

The composition of the present invention can be effectively inhibited from its foaming during heating and curing, with usually being used after the respective components are blended in prescribed proportions, then stirred for 60 to 120 minutes, and then subjected to defoaming under reduced pressure.

As to the composition of the present invention, the thickening onset temperature of the composition under measurement conditions of a frequency of 1 Hz and a temperature rise rate of 10° C./minute is preferably 50 to 120° C., and the thickening onset temperature is more preferably 60 to 100° C. The thickening onset temperature is a temperature at a minimum viscosity at which the encapsulation resin first turns to increase in viscosity with temperature rise in measurement with a rheometer by a dynamic viscoelasticity measurement method under the above-described measurement conditions. This can be determined from change in measured values of temperature versus viscosity.

The composition of the present invention preferably has a viscosity of 1 to 300 Pa·s as measured within the range of 15° C. or higher and lower than 50° C. from the viewpoint of workability. The viscosity can be controlled with the amount of the aforementioned thermally thickening resin particles (D) blended and the amount of the inorganic filler blended.

The curing temperature of the composition of the present invention can be controlled with the types and the amounts of the curing agent and the curing accelerator blended. Specific curing conditions in the flip-chip mounting are described in the following section of step (5).

The manufacturing method of the present invention is a method for manufacturing a semiconductor device with flip-chip mounting, the method comprising step (1) of supplying a liquid epoxy resin composition for semiconductor encapsulation to an electrode surface of a substrate having an electrode, step (2) of thickening the resin composition by heating the substrate, and step (3) of press-pressurizing a semiconductor chip with a bump formed, against the thickened resin composition under heating, and simultaneously spreading and filling the resin composition in a gap between the substrate and the semiconductor chip.

The manufacturing method of the present invention may further have step (4) of electrically connecting the bump to the electrode surface on the substrate and step (5) of heating the resin composition to cure it.

In the manufacturing method of the present invention, the composition of the present invention can be suitably used.

The manufacturing method of the present invention is described below. First, a substrate in which a prescribed solder resist pattern has been applied to a substrate with a circuit formed is prepared. To a surface of the substrate, on which a chip is to be disposed (i.e., an electrode surface), is applied a liquid epoxy resin composition for semiconductor encapsulation, preferably the composition of the present invention, by a print method or a dispensing method (step (1)). In this step, in order to secure the application workability of the resin composition well, the resin composition is supplied to the substrate in the temperature range of 15° C. or higher and lower than 50° C. The composition of the present invention maintains its liquid state, preferably a viscosity of 1 to 300 Pa·s, in this temperature range. The amount applied is adjusted to an amount that is necessary for encapsulation, and not excessive but requisite minimum.

Then, the resin composition is increased in viscosity by heating the substrate (step (2)). Specifically, the substrate where the epoxy resin composition is supplied to its electrode surface is heated by such means as a hot plate or an oven, so that the resin composition is thickened. Desirably, the heating temperature is 50 to 120° C. and the heating time is 1 to 30 minutes. Moreover, the viscosity of the thickened epoxy resin composition is desirably within the range of 10 to 4000 Pa·s. This viscosity refers to a viscosity measured at 1 Hz by a dynamic viscoelasticity measurement method. Increasing the viscosity of the encapsulation resin in step (2) makes it possible to eliminate voids trapped in a posterior step. When the viscosity of the encapsulation resin is lower than that range, it is difficult to eliminate voids. When the viscosity is higher than that range, it is difficult to connect a bump. In step (2), the epoxy resin is not substantially cured.

Then, a chip having a Cu post is disposed at a prescribed position commonly with a jig, and while the chip is press-pressurized against a substrate having the thickened resin composition under heating, and simultaneously the resin composition is spread and filled in a gap between the substrate and the flip-chip (step (3)). Desirably, the heating temperature is controlled so that the resin temperature at the time of press pressurization is 150 to 180° C. The pressing rate at which the chip is pressed against the substrate is desirably 0.01 to 5 mm/s. The press pressurization condition is generally 1 to 15 g/post, preferably 3 to 10 g/post, and the heating time is generally 0.5 to 10 seconds, preferably 1 to 5 seconds. In step (3), temperature rise may be continued until arrival at complete curing of the encapsulation resin under maintenance of the resin at a high viscosity preferably by use of the composition of the present invention.

In step (4) of electrically connecting a bump, for example, a Cu bump with a solder layer formed at a tip of a Cu post, to a prescribed connection position on the aforementioned substrate, a solder provided at the tip of a Cu post is melted and the Cu post is electrically connected by fusion to the prescribed connection position on the substrate. Step (4) is attained by heating to a temperature equal to or higher than the solder melting temperature. The melting temperature is generally 200 to 300° C. Therefore, it is also possible to perform step (3) and step (4) actually simultaneously, for example, by raising the temperature to equal to or higher than the solder melting temperature in step (3).

In step (5), the resin composition is cured by heating. The heating temperature is, for example, 200 to 300° C. in resin temperature, and the heating time is 0.5 to 10 seconds. Therefore, if, for example, step (5) is performed at a temperature equal to or higher than the solder melting temperature, it is also possible to realize solder melting and thus perform step (4) and step (5) actually simultaneously. Moreover, post cure may be performed as desired. The temperature and time conditions applied to post cure are preferably 120 to 180° C., more preferably 120 to 150° C., and preferably 30 to 120 minutes.

The order of step (4) and step (5) can be altered; for example, step (4) may be performed after step (5).

The semiconductor device of the present invention is not particularly limited and examples thereof include integrated circuit devices to be used for electronic equipment, such as cellular phones, smart phones, mobile equipment, and laptop computers, in which a Cu post chip is flip-chip mounted.

EXAMPLES

The present invention is described below in more detail by providing Examples, but the present invention is not limited thereto.

Examples 1 to 12 and Comparative Examples 1 to 4

Components in amounts (in part(s) by weight) shown in Table 1 and Table 2 were blended and mixed at room temperature to prepare each of homogeneous liquid compositions.

Using each of the resulting compositions, the following items were measured and evaluated by the methods described below. The results are shown in Table 1 and Table 2.

(1) Presence or Absence of Voids

Each of the compositions was dispensed on a substrate at 25° C. so that the amount applied was 3 mg. Next, the substrate was heated with a hot plate at 80° C. for 10 minutes and then the substrate and a chip were pressure-welded together. Regarding the pressure welding conditions, pressure welding was performed at a pressing rate of 0.3 mm/sec and a pressing pressure of 5 g/post for 3 seconds under heating so that the resin temperature at the time of press pressurization was 160° C. The pressure-welded sample was heated at a peak temperature of 260° C. for 4 seconds to melt the solder and cure the encapsulation resin, so that a sample for evaluation was prepared. The presence or absence of voids was observed and evaluated by ultrasonic inspection and flat surface grinding. Package used: MB50-010JY CR/WALTS corporation.
Evaluation
  ⊚: No voids were seen in the encapsulation resin.
  ○: There were voids present in a part of the encapsulation resin, but there were no voids extending over bumps.
  x: There were voids throughout the encapsulation resin or there were voids extending over bumps.

(2) Dispensing Property

An encapsulation resin was discharged at 25° C. using a metal needle 20G produced by Musashi and evaluated by the following criteria.
Evaluation
  ⊚: 4 mg could be discharged within 3 seconds.
  ○: 4 mg could be discharged within 3 to 5 seconds.
  x: It took more than 5 seconds to discharge 4 mg.

(3) Connectivity

The solder shape was examined and evaluated by ultrasonic inspection and cross-sectional observation. Package used: MB50-010JY/WALTS corporation.
Evaluation
  ○: The solder on the substrate side and the solder on the chip's bump side were connected to each other.
  x: The solder on the substrate side and the solder on the chip's bump side were not connected to each other or the shape of the solder weld was constricted.

(4) Viscosity Stability

The viscosity at 40° C. was measured with time with a rheometer (AR-G2, manufactured by TA Instruments; the same applies hereinafter) and then evaluated.
Evaluation
  ⊚: The viscosity was 1.5 times or less after 6 hours.
  ○: The viscosity was 1.5 times or less after 3 hours.

(5) Viscosity (25° C.)

The viscosity was measured at 25° C. with an HBT rotational viscometer and the viscosity at 10 rpm was read.

(6) Viscosity (at 80° C., after a Lapse of 10 Minutes)

The viscosity was read with a rheometer at 10 minutes after fixing the temperature at 80° C.

(7) Thickening Onset Temperature

The temperature at which the viscosity of an encapsulation resin started to increase was read during measurement with a rheometer at a frequency of 1 Hz and a temperature rise rate of 10° C./minute. A case where no increase in viscosity was detected even though the temperature was raised to 120° C. was rated as "no thickening".

The meanings of the terms in each table are as follows.
Epoxy resin: 1,6-bis(2,3-epoxypropoxy)naphthalene
Curing agent: trialkyltetrahydroxyphthalic anhydride
Acrylic rubber particle (1): acrylic resin particle with an average particle diameter of 2 μm, F301 (trade name) produced by Ganz Chemical Co., Ltd.
Acrylic rubber particle (2): acrylic resin particle with an average particle diameter of 1 μm, JF003 (trade name) produced by Mitsubishi Rayon Co., Ltd.
Acrylic rubber particle (3): acrylic resin particle with an average particle diameter of 1 μm, JF001 (trade name) produced by Mitsubishi Rayon Co., Ltd.
Acrylic rubber particle (4): acrylic resin particle with an average particle diameter of 1 μm, F320 (trade name) produced by Ganz Chemical Co., Ltd.
Acrylic rubber particle (5): acrylic resin particle META-BLEN C-140A (trade name) produced by Mitsubishi Rayon Co., Ltd.
Silica filler: average particle diameter=2.0 μm (spherical fused silica)
Silane coupling agent: epoxysilane
Curing accelerator: imidazole-based curing accelerator

TABLE 1

|  | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| Epoxy resin | 100 | 100 | 100 | 100 | 100 | 100 | 100 | 100 | 100 | 100 | 100 | 100 |
| Curing agent | 170 | 170 | 170 | 170 | 170 | 170 | 170 | 170 | 170 | 170 | 170 | 170 |
| Acrylic rubber | 40 | 60 | 15 | 5 | — | — | — | — | — | 40 | 40 | 40 |

TABLE 1-continued

|  | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| particle (1) |  |  |  |  |  |  |  |  |  |  |  |  |
| Acrylic rubber particle (2) | — | — | — | — | 40 | 60 | 15 | — | — | — | — | — |
| Acrylic rubber particle (3) | — | — | — | — | — | — | — | 40 | — | — | — | — |
| Acrylic rubber particle (4) | — | — | — | — | — | — | — | — | 40 | — | — | — |
| Acrylic rubber particle (5) | — | — | — | — | — | — | — | — | — | — | — | — |
| Silica filler | 570 | 520 | 500 | 480 | 570 | 520 | 500 | 570 | 570 | 460 | 620 | 640 |
| Silane coupling agent | 3 | 3 | 3 | 3 | 3 | 3 | 3 | 3 | 3 | 3 | 3 | 3 |
| Curing accelerator | 8 | 8 | 8 | 8 | 8 | 8 | 8 | 8 | 8 | 8 | 8 | 8 |
| Void | ⊙ | ⊙ | ⊙ | ○ | ⊙ | ⊙ | ⊙ | ⊙ | ○ | ⊙ | ⊙ | ⊙ |
| Dispensing property | ⊙ | ⊙ | ⊙ | ⊙ | ⊙ | ⊙ | ⊙ | ⊙ | ⊙ | ⊙ | ⊙ | ⊙ |
| Connectivity | ○ | ○ | ○ | ○ | ○ | ○ | ○ | ○ | ○ | ○ | ○ | ○ |
| Viscosity stability at the time of dispensing | ⊙ | ⊙ | ⊙ | ⊙ | ⊙ | ⊙ | ⊙ | ○ | ⊙ | ⊙ | ⊙ | ⊙ |
| Viscosity (25° C.) (Pa·s) | 90 | 80 | 40 | 35 | 100 | 90 | 50 | 100 | 90 | 50 | 130 | 150 |
| Viscosity (at 80° C., after 10 minutes) (Pa·s) | 2300 | 3200 | 35 | 10 | 2500 | 3500 | 40 | 2700 | 1000 | 2500 | 2500 | 2500 |
| Thickening onset temperature (° C.) | ≥70 | ← | ← | ← | ≥80 | ← | ← | ≤50 | ≥70 | ← | ← | ← |

TABLE 2

|  | Comparative Example 1 | Comparative Example 2 | Comparative Example 3 | Comparative Example 4 |
|---|---|---|---|---|
| Epoxy resin | 100 | 100 | 100 | 100 |
| Curing agent | 170 | 170 | 170 | 170 |
| Acrylic rubber particle (1) | — | 2.5 | 65 | — |
| Acrylic rubber particle (2) | — | — | — | — |
| Acrylic rubber particle (3) | — | — | — | — |
| Acrylic rubber particle (4) | — | — | — | — |
| Acrylic rubber particle (5) | — | — | — | 40 |
| Silica filler | 550 | 480 | 470 | 570 |
| Silane coupling agent | 3 | 3 | 3 | 3 |
| Curing accelerator | 8 | 8 | 8 | 8 |
| Void | X | X | ⊙ | X |
| Dispensing property | ⊙ | ⊙ | ○ | ○ |
| Connectivity | ○ | ○ | X | ○ |
| Viscosity stability at the time of dispensing | ⊙ | ⊙ | ⊙ | ⊙ |
| Viscosity (25° C.) (Pa·s) | 60 | 40 | 50 | 100 |
| Viscosity (at 80° C., after 10 minutes) (Pa·s) | ≤0.1 | 1 | 4500 | ≤0.1 |
| Thickening onset temperature (° C.) | No thickening | ≥70 | ← | No thickening |

The above examples showed that the compositions of the present invention had no voids and realized such characteristics as excellent dispensing property and excellent connectivity, which are necessary conditions for flip-chip mounting of a Cu post chip. On the other hand, the compositions of the comparative examples did not exhibit sufficient performance in voids, dispensing property, or connectivity.

The invention claimed is:

1. An epoxy resin composition for semiconductor encapsulation for flip-chip mounting, the composition containing an epoxy resin (A), a curing agent (B), a curing accelerator (C), and 15 to 64 parts by weight, relative to 100 parts by weight of the component (A), of thermally thickening resin particles (D) having a volume-average primary particle diameter of 0.2 to 10 μm, wherein the composition further contains 55 to 67 parts by weight of an inorganic filler relative to 100 parts by weight of the whole of the resin composition, and the curing agent (B) is trialkyltetrahydrophthalic anhydrides, the composition contains 11 to 15 parts by weight of the curing accelerator (C) relative to 100 parts by weight of the epoxy resin (A), and the flip-chip mounting is resin pre-setting mounting.

2. The composition according to claim 1, wherein the thermally thickening resin particles (D) are acrylic resin particles.

3. The composition according to claim 1, wherein the flip-chip is a flip-chip having a Cu bump which has a solder layer formed at a tip of a Cu post.

4. A method for manufacturing a semiconductor device with flip-chip mounting, the method comprising step (1) of supplying the epoxy resin composition for semiconductor encapsulation according to claim 1 to an electrode surface of a substrate having an electrode, step (2) of thickening the resin composition by heating the substrate, and step (3) of press-pressurizing a semiconductor chip with a bump formed, against the thickened resin composition under heating, and simultaneously spreading and filling the resin composition in a gap between the substrate and the semiconductor chip.

5. The method for manufacturing a semiconductor device according to claim 4, wherein the temperature of the resin composition during its supply is 15° C. or higher and lower than 50° C. and the viscosity is 1 to 300 Pa·s in step (1), and the viscosity of the thickened epoxy resin composition is within the range of 10 to 4000 Pa·s in step (2).

6. The method for manufacturing a semiconductor device according to claim 4, wherein heating conditions include a heating temperature of 50 to 120° C. and a heating time of 1 to 30 minutes in step (2).

7. The method for manufacturing a semiconductor device according to claim 4, wherein in step (3) the press pressurization is carried out at a pressing rate of 0.01 to 5 mm/s under heating so that the resin temperature during the press pressurization is 150 to 180° C.

8. The method for manufacturing a semiconductor device according to claim 4, wherein the method further comprises step (4) of electrically connecting the bump to the electrode surface on the substrate and step (5) of heating the resin composition to cure it.

9. The method for manufacturing a semiconductor device according to claim 8, wherein the bump is a Cu bump which has a solder layer formed at a tip of a Cu post and the substrate having an electrode is a substrate that, excluding its electrode surface, is covered with a solder resist, and wherein heating is conducted to a temperature equal to or higher than a solder melting temperature in step (4).

\* \* \* \* \*